(12) United States Patent
Seo et al.

(10) Patent No.: US 8,604,691 B2
(45) Date of Patent: Dec. 10, 2013

(54) DISPLAY DEVICE AND METHOD OF MANUFACTURING THE SAME

(75) Inventors: Hae-Kwan Seo, Yongin (KR); Tae-Jin Kim, Yongin (KR)

(73) Assignee: Samsung Display Co., Ltd., Yongin-si (KR)

( * ) Notice: Subject to any disclaimer, the term of this patent is extended or adjusted under 35 U.S.C. 154(b) by 413 days.

(21) Appl. No.: 12/984,872

(22) Filed: Jan. 5, 2011

(65) Prior Publication Data

US 2011/0273411 A1 Nov. 10, 2011

(30) Foreign Application Priority Data

May 7, 2010 (KR) .......................... 10-2010-0043053

(51) Int. Cl.
*H01J 1/62* (2006.01)
(52) U.S. Cl.
USPC .......................................... 313/511; 313/498
(58) Field of Classification Search
USPC .................. 313/498, 506, 509, 510, 511, 512
See application file for complete search history.

(56) References Cited

U.S. PATENT DOCUMENTS

| 7,444,772 | B2 * | 11/2008 | Harasawa et al. ............... 40/586 |
| 7,593,086 | B2 | 9/2009 | Jeong et al. |
| 2002/0160546 | A1 | 10/2002 | Nozawa et al. |
| 2006/0028128 | A1 | 2/2006 | Ohkubo |

FOREIGN PATENT DOCUMENTS

| JP | 2003-015548 | 1/2003 |
| JP | 2004-042661 | 2/2004 |
| JP | 2004-252178 | 9/2004 |
| JP | 2005-251671 | 9/2005 |
| KR | 10-2006-0056755 A | 5/2006 |
| KR | 10-2007-0016200 | 2/2007 |
| KR | 10-2007-0041130 | 4/2007 |
| KR | 10-2009-0050586 | 5/2009 |
| WO | WO 2008/083921 A1 | 7/2008 |
| WO | WO 2009/064140 A2 | 5/2009 |
| WO | WO 2009/142591 A1 | 11/2009 |
| WO | WO 2010/144366 A1 | 12/2010 |

OTHER PUBLICATIONS

Extended European Search Report dated Aug. 24, 2011, for corresponding European application No. 11164813.5, 9 pps.
Korean Office action dated May 10, 2012 issued in Korean priority patent application No. 10-2010-0043053, 4 pages.

* cited by examiner

*Primary Examiner* — Vip Patel
(74) *Attorney, Agent, or Firm* — Christie, Parker & Hale, LLP

(57) ABSTRACT

Provided is a display device including: a flexible substrate; a display unit disposed on the substrate; and a driver integrated circuit (IC) to drive the display unit. The driver IC is divided into separate blocks that are disposed on opposing sides of a bending axis of the substrate.

10 Claims, 4 Drawing Sheets

DISPLAY DEVICE AND METHOD OF MANUFACTURING THE SAME

CROSS-REFERENCE TO RELATED APPLICATION

This application claims the benefit of Korean Patent Application No. 10-2010-0043053, filed on May 7, 2010, in the Korean Intellectual Property Office, the disclosure of which is incorporated herein, by reference.

BACKGROUND

1. Field

One or more aspects of the present invention relate to display devices, and methods of manufacturing the same.

2. Description of the Related Art

Flexible electronics and flexible display technologies have been developed for use in the manufacturing of display panels, by using flexible plastic substrates. Since a flexible display device has excellent portability and is easily attached to another device, unlike a typical hard-type panel formed on a glass substrate, a flexible display device is likely to suit various new application markets.

In general, a plastic substrate or etched glass is used as a substrate, in order to manufacture a flexible display device. In this case, when a display panel flaps or bends, integrated circuits included in the substrate may be damaged.

In addition, a driver integrated circuit (IC) for driving pixels in a display panel includes a back wrap for constituting a slim module, and the back wrap should not be damaged when bent or folded. That is, when a slim panel module is inserted into a card or paper, the panel module should not to be damaged along its horizontal or vertical bending axis.

SUMMARY

One or more aspects of the present invention provide display devices in which internal elements of a driver integrated circuit (IC) are installed into a display panel of a display device, such as an electric card, an electric sheet, an electric passport, or the like. Thus, when such a device is bent in a horizontal or vertical direction, the driver IC may be prevented from being damaged.

One or more aspects of the present invention provide methods of manufacturing the display devices.

According to an aspect of the present invention, there is provided a display device including: a substrate; a display panel disposed on the substrate; and a driver integrated circuit (IC) for driving the display panel, wherein the driver IC is disposed along a bending axis of the substrate.

According to various embodiments, the driver IC may be divided into functional blocks, wherein the functional blocks are arranged along opposing sides of the bending axis.

According to various embodiments, the functional blocks may include at least one of a scan block, a data block, a power generating block, and a memory block.

According to various embodiments, the bending axis may extend along the substrate in a horizontal and/or vertical direction.

According to various embodiments, the device may be an electric card, an electric passport, or an electric sheet.

According to various embodiments, the display panel may be an organic light-emitting diode (OLED) display panel.

According to various embodiments, the functional blocks may be connected to each other by metal wiring.

According to various embodiments, the driver IC may have a square or circular shape.

According to another aspect of the present invention, there is provided a display device including: a flexible substrate; a display panel disposed on the substrate; and a driver integrated circuit (IC) for driving the display panel. The driver IC is divided into functional blocks, including at least one of a scan block, a data block, a power generating block, and a memory block. The functional blocks are arranged along a bending axis of the substrate.

According to another aspect of the present invention, there is provided a method of manufacturing a display device, the method including providing a display panel; dividing a driver integrated circuit (IC) into functional blocks; and arranging the functional blocks along opposing sides of a bending axis of the substrate.

According to various embodiments, the functional blocks may include at least one of a scan block, a data block, a power generating block, and a memory block.

According to various embodiments, the bending axis may extend along the substrate in a horizontal or vertical direction.

According to various embodiments, the device may include at least one of an electric card, an electric passport, and an electric sheet.

According to various embodiments, the functional blocks may be connected to each other by metal wiring.

According to various embodiments, the display panel may be an organic light-emitting diode (OLED) panel.

Additional aspects and/or advantages of the invention will be set forth in part in the description which follows and, in part, will be obvious from the description, or may be learned by practice of the invention.

BRIEF DESCRIPTION OF THE DRAWINGS

These and/or other aspects and advantages of the invention will become apparent and more readily appreciated from the following description of the exemplary embodiments, taken in conjunction with the accompanying drawings, of which.

DETAILED DESCRIPTION

Figure 1A:
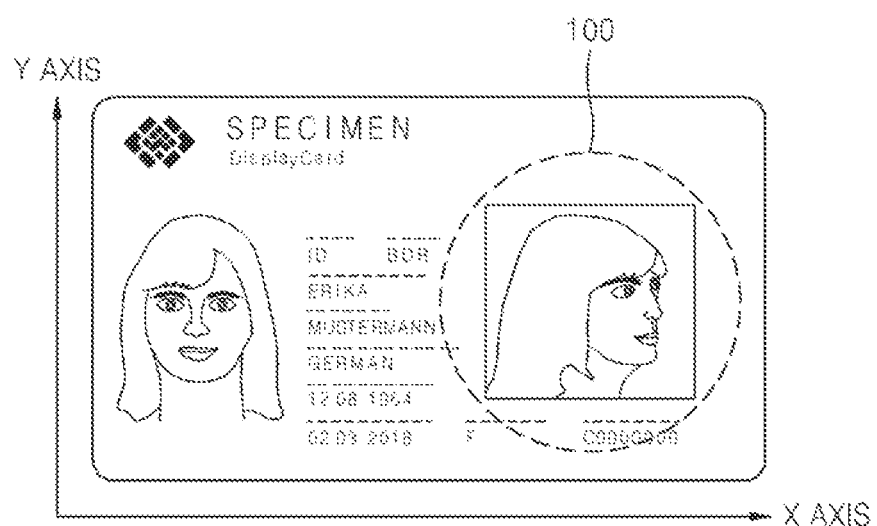
FIGS. 1A and 1B are diagrams of an electric card including a display device, and the display device, respectively.

Reference will now be made in detail to the exemplary embodiments of the present invention, examples of which are illustrated in the accompanying drawings, wherein like reference numerals refer to the like elements throughout. The exemplary embodiments are described below, in order to explain the aspects of the present invention, by referring to the figures.

Figure 1B:
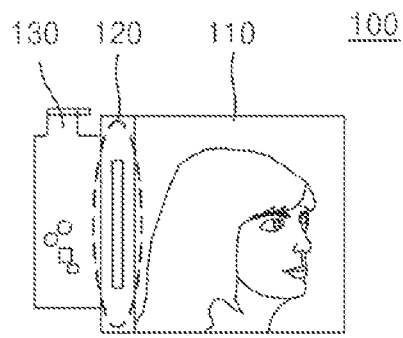

FIGS. 1A and 1B are diagrams of an electric card including a display device 100, and the display device 100, respectively. In FIG. 1A, a card-type module (electric card), into which the display device 100 is installed, is illustrated. As shown, the location of the display device 100 is indicated by the dashed circle. The card-type module includes a flexible substrate having indicia (i.e., name, date of birth, citizenship). The location of the display device 100 is not limited to the location shown in FIG. 1A, and may be any suitable location. While shown in the context of a card-type module, it is understood that the display device 100 could be mounted on the pages of a book or magazine, and/or wrapped into shape.

In FIG. 1B, the display device 100 includes a display panel 110, a driver integrated circuit (IC) 120, and an external inactive unit 130. The display panel 110 is a flexible display panel, such as a liquid crystal display (LCD) panel, or an organic light-emitting diode (OLED) panel, and may be an OLED panel for easily embodying a flexible and slim structure.

Figure 2A:
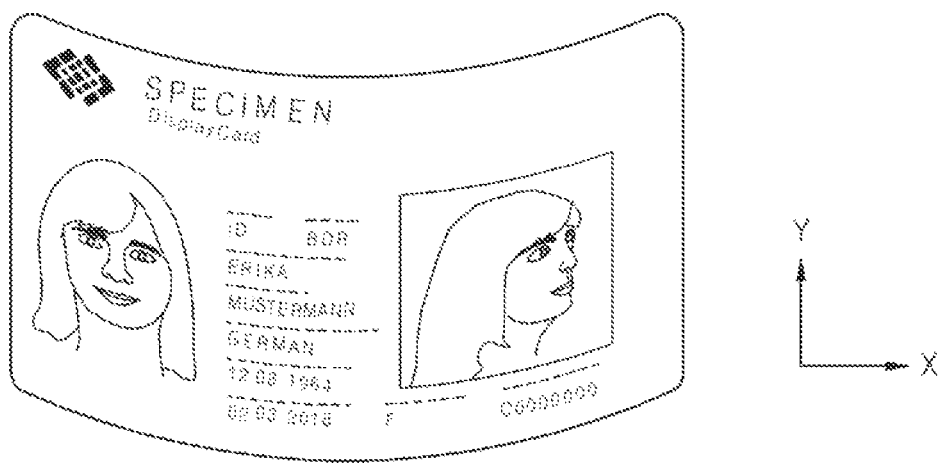
FIGS. 2A and 2B are diagrams of cases where the electric card of FIG. 1A is bent in an X-axis direction, and a Y-direction axis, respectively.
Figure 2B:
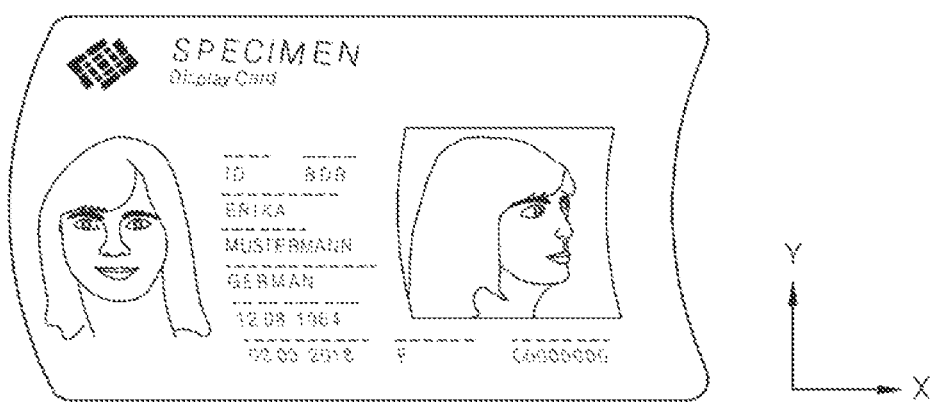

FIGS. 2A and 2B are diagrams of cases where the electric card of FIG. 1A is bent (compressed) in an X-axis (lengthwise) direction, and is bent (compressed) in a Y-direction axis (widthwise) direction, respectively. Referring to FIG. 2A, when a force is exerted in the X-axis direction, the electric card is vertically bent. A driver IC as well as a display panel may be damaged by such bending.

Referring to FIG. 2B, when a force is exerted in a Y-axis direction, the electric card is horizontally bent. The driver IC as well as the display panel may be damaged by such bending.

As shown in FIGS. 2A and 2B, if a flexible display device, instead of a flat display device, is installed into a device such as an electric card, an electric passport, or an electric sheet (as in a book, magazine, newspaper, or the like), when the device is bent, the display device is also bent. However, a driver IC for driving the display panel may be damaged by such bending.

Figure 3:
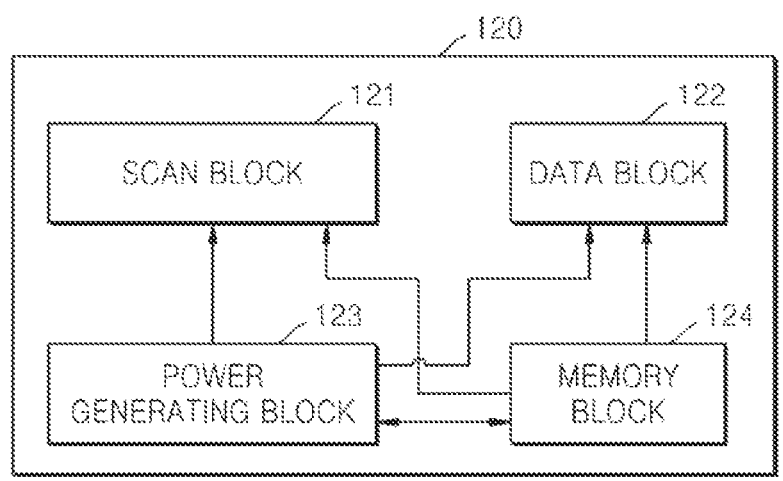
FIG. 3 is a block diagram of a driver integrated circuit (IC), according to an embodiment of the present invention.

FIG. 3 is a block diagram of the driver IC 120, according to an exemplary embodiment of the present invention. Referring to FIG. 3, the driver IC 120 is divided into four functional blocks. The functional blocks may collectively be a one-chip driver IC including a scan block 121, a data block 122, a power generating block 123, and a memory block 124, as shown, but the present invention is not limited thereto. According to an embodiment of the present invention, the driver IC 120 includes the four functional blocks. However, the driver IC 120 is not limited to any particular number or types of functional blocks.

The scan block 121 provides a gate control signal for driving a gate transistor in a pixel of the display panel 110. In this case, the display panel 110 may be, for example, an amorphous silicon gate (ASG) panel, or a low temperature poly silicon (LTPS) panel. The display panel 110 may include a gate shift register block. Thus, the scan block 121 of the driver IC 120 may output a signal for controlling the gate shift register of the scan block 121.

The data block 122 may include source drivers for respectively outputting image data signals, that is, red (R) green (G) blue (B) image data signals, to the display panel 110, a gamma adjusting circuit, a gray voltage generating circuit, and the like. The power supplying block 123 supplies power to the functional blocks 121 through 124 of the driver IC 120, and the display panel 110.

The memory block 124 includes a timing unit, a graphic random access memory (RAM), a power controller, a microcontroller unit (MCU) interface, and the like. The timing unit generates timing signals for operating the scan block 121 and the data block 122. The power controller outputs a power supply controlling signal.

According to an embodiment of the present invention, the functional blocks 121 through 124 all constitute ICs. In addition, the functional blocks 121 through 124 are connected to each other be metal wiring. Typically, functional blocks are collectively arranged on a one-chip board. However, according to the present embodiment, the functional blocks 121 through 124 are each integrated on respective boards. The boards are connected to each other by metal wiring, and are installed in the display panel. It is also understood that such connections may be established through other mechanisms, including other types of conductive wiring.

Figure 4:
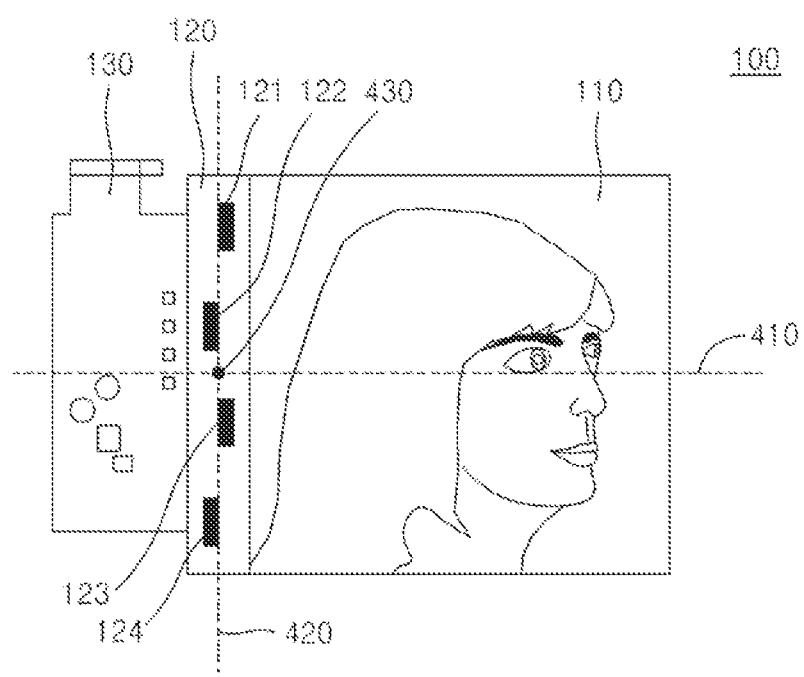
FIG. 4 is a schematic diagram of a display device according to an embodiment of the present invention.

FIG. 4 is a schematic diagram of a display device 100, according to an embodiment of the present invention. Referring to FIG. 4, functional blocks 121 through 124 of a driver IC 120 are arranged along a bending axis of the display device 100. In this case, the functional blocks 121 through 124 include the scan block 121, the data block 122, the power generating block 123, and the memory block 124. The functional blocks 121 through 124 are not limited to the shown arrangement and may be in other arrangements.

As shown in FIG. 4, the bending axis includes a horizontal (lengthwise) reference line 410, a vertical (widthwise) reference line 420, and an intersection 430 between the horizontal reference line 410 and the vertical reference line 420. Thus, the functional blocks 121 through 124 are arranged so as to be unaffected by the bending of the device 100 in the horizontal and/or vertical direction, about the reference lines 410 and 420. For example, in order to prevent the driver IC 120 from being damaged by bending along the horizontal reference line 410, the functional blocks 121 and 122 are arranged above the horizontal reference line 410, and the functional blocks 123 and 124 are arranged below the horizontal reference line 410. In addition, in consideration of the influence of the bending along the vertical reference line 420, the functional blocks 122 and 124 are arranged to the left of the vertical reference line 420, and the functional blocks 121 and 123 are arranged to the right of the vertical reference line 420. While shown with two reference lines, it is understood that the functional blocks could be arranged around other numbers of reference lines, and that the reference lines could be for diagonal and/or non-orthogonal axes.

The functional blocks 121 through 124 may be arranged as shown in FIG. 4, or may be arranged according to the functions and relationships therebetween. In addition, the horizontal reference line 410 and the vertical reference line 420 may be determined according to a bending direction of a particular type of display device 100, a location of the display device 100, and the like.

According to an embodiment of the present invention, the device is the electric card, but the present embodiment is not limited thereto. For example, the device may be any device including a flexible display device, such as an electric passport, or an electric sheet. The display panel includes a LCD or OLED panel, and may be an OLED panel for easily embodying a flexible and slim structure. In FIG. 4, the functional blocks 121 through 124 have a rectangular shape, but the present embodiment is not limited thereto, and may have another shape, for example, a circular shape.

Figure 5:
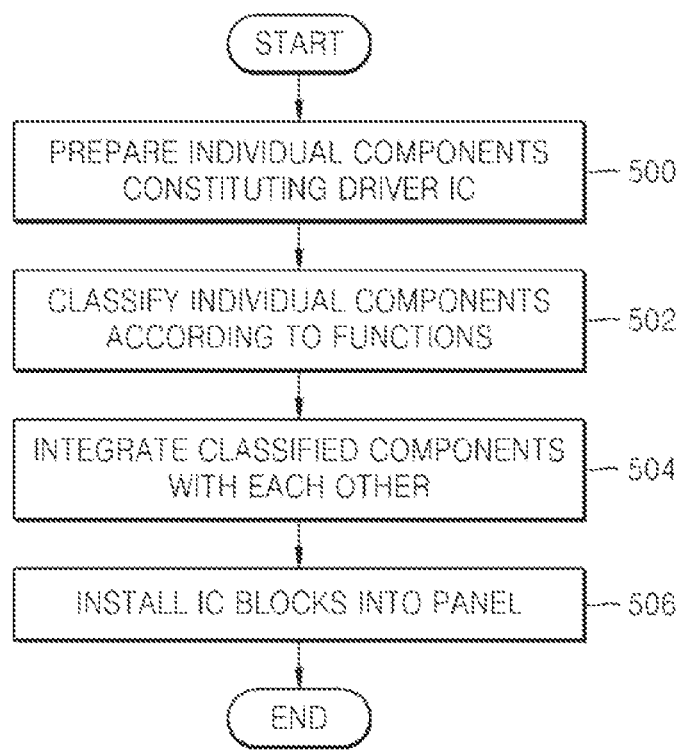
FIG. 5 is a flowchart of a method of manufacturing a display device, according to an embodiment of the present invention.

FIG. 5 is a flowchart of a method of manufacturing a display device, according to an exemplary embodiment of the present invention. Referring to FIG. 5, in operation 500, individual components constituting a driver IC are prepared. In this case, the individual components may include components integrated with the driver IC for driving a display panel, such as a scan signal generating circuit, a data signal generating circuit, a gamma correction circuit, a power voltage generating circuit, a timing generating circuit, and the like.

In operation 502, the individual components are positioned according to their functions. According to an embodiment of the present invention, the individual components are largely divided into a scan block, a data block, a power generating block, and a memory block.

In operation 504, the four functional blocks are integrated with each other. In operation 506, the functional blocks are installed into a display panel. In this case, the display panel includes a LCD or OLED panel, and may be an ASG or LTPS panel. In addition, the integrated functional blocks are arranged along a bending axis of a device into which a display panel 110 is installed. The functional blocks are connected to each other through metal wiring. As described above, the functional blocks are arranged along the bending axis, in order to prevent the driver IC from being damaged by the bending along one or more bending axes.

As described above, according to the one or more embodiments of the present invention, internal elements of a driver IC are divided according to their functions, and are installed into a display panel. Thus, although a device including a display device, such as an electric card, an electric sheet, an electric passport, or the like, is bent in a horizontal or vertical direction, the driver IC may be prevented from being damaged.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A display device comprising:
    a display panel; and
    a driver integrated circuit (IC) configured to drive the display panel,
    wherein the display device is bendable about at least one bending axis extending along at least one of a length or a width of the display device to divide the display device into regions, and
    wherein the driver IC comprises functional blocks in each of the regions and arranged along the at least one bending axis, the functional blocks comprising at least one of a scan block, a data block, a power generating block, or a memory block.

2. The display device of claim 1, wherein the functional blocks are arranged along opposing sides of the at least one bending axis.

3. The display device of claim 2, further comprising metal wiring to couple the functional blocks to each other.

4. The display device of claim 1, wherein the display device is an electric card, an electric passport, or an electric sheet.

5. The display device of claim 1, wherein the display panel is an organic light-emitting diode (OLED) panel.

6. The display device of claim 1, wherein the driver IC has a rectangular or circular shape.

7. A method of manufacturing a display device, the method comprising:
    arranging functional blocks of a driver integrated circuit (IC) configured to drive a display panel,
    wherein the display device is bendable about at least one bending axis extending along at least one of a length or a width of the display device to divide the display device into regions, and
    wherein the functional blocks are in each of the regions and arranged along the at least one bending axis, the functional blocks comprising at least one of a scan block, a data block, a power generating block, or a memory block.

8. The method of claim 7, wherein the device is an electric card, an electric passport, or an electric sheet.

9. The method of claim 7, wherein the functional blocks are coupled to each other through metal wiring.

10. The method of claim 7, wherein the display panel comprises an organic light-emitting diode (OLED) panel.

* * * * *